US010550032B2

(12) United States Patent
Sanderson et al.

(10) Patent No.: US 10,550,032 B2
(45) Date of Patent: Feb. 4, 2020

(54) COATED GLAZING

(71) Applicant: PILKINGTON GROUP LIMITED, Lathom (GB)

(72) Inventors: Kevin David Sanderson, Upholland (GB); Neil McSporran, Perrysburg, OH (US); David Alan Strickler, Toledo, OH (US); Leo James Pyrah, Hale (GB)

(73) Assignee: Pilkington Group Limited, Lathom (GB)

( * ) Notice: Subject to any disclaimer, the term of this patent is extended or adjusted under 35 U.S.C. 154(b) by 327 days.

(21) Appl. No.: 15/330,149

(22) PCT Filed: Feb. 24, 2015

(86) PCT No.: PCT/GB2015/050512
§ 371 (c)(1),
(2) Date: Aug. 16, 2016

(87) PCT Pub. No.: WO2015/124951
PCT Pub. Date: Aug. 27, 2015

(65) Prior Publication Data
US 2017/0081241 A1 Mar. 23, 2017

(30) Foreign Application Priority Data

Feb. 24, 2014 (GB) .................................. 1403223.9

(51) Int. Cl.
| | | |
|---|---|---|
| *B32B 15/04* | (2006.01) | |
| *C03C 17/34* | (2006.01) | |
| *C03C 15/00* | (2006.01) | |
| *H01L 51/52* | (2006.01) | |
| *H01L 31/0216* | (2014.01) | |
| *H01L 31/0224* | (2006.01) | |
| *H01L 31/0236* | (2006.01) | |
| *C03C 17/245* | (2006.01) | |
| *H01L 31/18* | (2006.01) | |
| *H01L 33/42* | (2010.01) | |
| *H01L 33/58* | (2010.01) | |
| *H01L 51/56* | (2006.01) | |

(52) U.S. Cl.
CPC .......... *C03C 17/3417* (2013.01); *C03C 15/00* (2013.01); *C03C 17/245* (2013.01); *C03C 17/2453* (2013.01); *C03C 17/2456* (2013.01); *H01L 31/02168* (2013.01); *H01L 31/02366* (2013.01); *H01L 31/022466* (2013.01); *H01L 31/1888* (2013.01); *H01L 33/42* (2013.01); *H01L 33/58* (2013.01); *H01L 51/5206* (2013.01); *H01L 51/5234* (2013.01); *H01L 51/5268* (2013.01); *C03C 2204/08* (2013.01); *C03C 2217/94* (2013.01); *C03C 2217/944* (2013.01); *C03C 2217/948* (2013.01); *C03C 2218/152* (2013.01); *H01L 51/56* (2013.01); *H01L 2251/305* (2013.01); *H01L 2933/0016* (2013.01); *H01L 2933/0058* (2013.01); *H01L 2933/0091* (2013.01)

(58) Field of Classification Search
USPC .......... 428/426, 432, 688, 701, 702
See application file for complete search history.

(56) References Cited

U.S. PATENT DOCUMENTS

| | | | |
|---|---|---|---|
| 2007/0228369 A1 | 10/2007 | Suzuki | |
| 2008/0308146 A1* | 12/2008 | Krasnov | H01L 31/18 136/256 |
| 2009/0194157 A1* | 8/2009 | den Boer | H01L 31/02246 136/256 |
| 2010/0089444 A1* | 4/2010 | Thomsen | H01L 31/02246 136/256 |
| 2010/0285290 A1 | 11/2010 | Lu | |
| 2011/0020621 A1 | 1/2011 | Coster et al. | |
| 2011/0126890 A1* | 6/2011 | Borrelli | H01L 31/02366 136/255 |
| 2012/0091488 A1 | 4/2012 | Vermersch | |
| 2013/0340817 A1* | 12/2013 | Bailat | H01L 31/02246 136/255 |
| 2014/0044977 A1* | 2/2014 | Manning | C03C 17/3417 428/432 |
| 2014/0170799 A1 | 6/2014 | Teramae et al. | |

FOREIGN PATENT DOCUMENTS

| | | |
|---|---|---|
| CN | 101764169 A | 6/2010 |
| CN | 102034881 A | 4/2011 |
| CN | 102863156 A | 1/2013 |
| CN | 103346200 A | 10/2013 |
| EP | 2754645 A1 | 7/2014 |
| JP | 01230451 A | 9/1989 |
| JP | 08165144 A | 6/1996 |
| JP | 2012133944 A | 7/2012 |
| JP | 2012523071 A | 9/2012 |
| JP | 2013087043 A | 5/2013 |
| WO | WO 2008154128 A | 12/2008 |
| WO | WO 2009073058 A | 6/2009 |
| WO | 2011006883 A2 | 1/2011 |
| WO | WO2011/089990 A | 7/2011 |
| WO | 2013035746 A1 | 3/2013 |
| WO | WO2013035746 * | 3/2013 |
| WO | WO 2013/171846 A | 11/2013 |
| WO | WO2014048927 A | 4/2014 |
| WO | 2013031851 A1 | 3/2015 |
| WO | 2013035746 A1 | 3/2015 |

OTHER PUBLICATIONS

WO2013035746 English machine translation, 2013.*
Aswin Hongsingthong et al, "ZnO Films with Very High Haze Value for Use as Front Transparent Conductive Oxide Films in Thin-Film Silicon Solar Cells", Applied Physics Express 3, The Japan Society of Applied Physics, May 1, 2010, pp. 51102-1 to 51102-3, vol. 3, No. 5, XP-002612220, Japan.

(Continued)

*Primary Examiner* — Lauren R Colgan
(74) *Attorney, Agent, or Firm* — Marshall & Melhorn, LLC

(57) ABSTRACT

A coated glazing comprising: a transparent glass substrate, wherein a surface of the substrate is directly or indirectly coated with at least one layer based on a transparent conductive coating (TCC) and/or at least one layer based on a material with a refractive index of at least 1.75, and wherein said surface has an arithmetical mean height of the surface value, Sa, of at least 0.4 nm prior to said coating of said surface.

13 Claims, No Drawings

(56) References Cited

OTHER PUBLICATIONS

Aswin Hongsingthong et al, "Development of textured ZnO-coated low-cost glass substrate with very high haze ratio for silicon-based thin film solar cells", Thin Solid Films, Jun. 1, 2013, vol. 537, pp. 291-295, Eslevier B.V., XP055190069.
European Patent Office, The International Search Report and Written Opinion issued in PCT/GB2015/050512, dated May 27, 2015, 13 pages, European Patent Office, Rijswijk, Netherlands.
Zhang Canyong, Nuclear Energy and New Energy Generation Technology, China Electric Power Press, Mar. 2009, p. 183.

* cited by examiner

COATED GLAZING

BACKGROUND OF THE INVENTION

This invention relates to a coated glazing, a method of manufacture of said glazing and the use of an acidic gas to increase the haze (light scattering) exhibited by a coated glazing.

There is currently significant interest in devices such as photovoltaic (PV) modules, light emitting diodes (LEDs) and organic light emitting diodes (OLEDs). There is also considerable attention given to glass for horticulture. Manufacturers of these devices and glazings aim to manipulate light in a number of different ways.

Photovoltaic (PV) modules or solar cells are material junction devices which convert sunlight into direct current (DC) electrical power. When exposed to sunlight (consisting of energy from photons), the electric field of PV module p-n junctions separates pairs of free electrons and holes, thus generating a photo-voltage. A circuit from n-side to p-side allows the flow of electrons when the PV module is connected to an electrical load, while the area and other parameters of the PV module junction determine the available current. Electrical power is the product of the voltage times the current generated as the electrons and holes recombine.

It is to be understood that in the context of the present invention the term "PV module" includes any assembly of components generating the production of an electric current between its electrodes by conversion of solar radiation, whatever the dimensions of the assembly, the voltage and the intensity of the produced current, and whether or not this assembly of components presents one or more internal electrical connection(s) (in series and/or parallel). The term "PV module" within the meaning of the present invention is thus here equivalent to "photovoltaic device" or "photovoltaic panel", as well as "photovoltaic cell".

PV modules rely on substances known as semiconductors. Semiconductors are insulators in their pure form, but are able to conduct electricity when heated or combined with other materials. A semiconductor mixed, or "doped", for example with phosphorous develops an excess of free electrons. This is known as an n-type semiconductor. A semiconductor doped with other materials, such as boron, develops an excess of "holes," spaces that accept electrons. This is known as a p-type semiconductor.

A PV module joins n-type and p-type materials, with a layer in between known as a junction. Even in the absence of light, a small number of electrons move across the junction from the n-type to the p-type semiconductor, producing a small voltage. In the presence of light, photons dislodge a large number of electrons, which flow across the junction to create a current which can be used to power electrical devices.

Traditional PV modules use silicon in the n-type and p-type layers. The newest generation of thin-film PV module uses thin layers of cadmium telluride (CdTe), amorphous or microcrystalline silicon, or copper indium gallium deselenide (CIGS) instead.

The semiconductor junctions are formed in different ways, either as a p-i-n device in amorphous silicon (a-Si), or as a hetero-junction (e.g. with a thin cadmium sulphide layer that allows most sunlight to pass through) for CdTe and CIGS. In their simplest form, a-Si cells suffer from significant degradation in their power output (in the range 15-35%) when exposed to the sun. Better stability requires the use of thinner layers, however, this reduces light absorption and hence cell efficiency. This has led the industry to develop tandem and even triple layer devices that contain p-i-n cells stacked on top of each other.

Generally a transparent conductive oxide (TCO) layer forms the front electrical contact of the cell, and a metal layer forms the rear contact. The TCO may be based on doped zinc oxide (e.g. ZnO:Al [ZAO] or ZnO:B), tin oxide doped with fluorine ($SnO_2$:F) or an oxide material of indium and tin (ITO). These materials are deposited chemically, such as for example by chemical vapour deposition ("CVD"), or physically, such as for example by vacuum deposition by magnetron sputtering.

For PV modules it can be advantageous to scatter the light that enters the module in order to improve its quantum efficiency. With respect to thin film silicon PV modules, it would be useful to increase the angle of scatter, and hence improve the trapping of weakly absorbed long wavelength light in the module.

LEDs are forward-biased p-n junction diodes made of semiconductor materials. A depletion region forms spontaneously across a p-n junction and prevents electrons and holes from recombining. When the p-n junction is forward-biased (switched on) with a sufficient voltage, the depletion region is narrowed and electrons can overcome the resistivity of the depletion region to cross the p-n junction into the p-type region where the recombination of electron-hole pairs causes the release of energy via the emission of light. This effect is called electroluminescence and the colour of the light is determined by the energy gap of the semiconductor. It is to be understood that in the context of the present invention the term "LED" includes any assembly of components that utilises a diode of semiconductor material that emits light when a forward bias is applied.

Early LED devices emitted low-intensity red light, but modern LEDs are available across the visible, ultraviolet and infra red wavelengths, with very high brightness. LEDs present many advantages over traditional light sources including lower energy consumption, longer lifetime, improved robustness, smaller size and faster switching. However, they are relatively expensive and require more precise current and heat management than traditional light sources. Applications of LEDs are diverse. They are used as low-energy indicators but also for replacements for traditional light sources in general lighting and automotive lighting. The compact size of LEDs has allowed new text and video displays and sensors to be developed, while their high switching rates are useful in communications technology.

OLEDs are LEDs in which the emissive electroluminescent layer(s) is a film of or based mainly on organic materials which emit light in response to an electric current. The organic molecules are electrically conductive as a result of delocalization of pi electrons caused by conjugation over all or part of the molecule. This layer of organic semiconductor material is situated between two electrodes in some cases. Generally, at least one of these electrodes is transparent. It is to be understood that in the context of the present invention the term "OLED" includes any assembly of components that utilises a diode of organic semiconductor material that emits light when a forward bias is applied. OLEDs can be used in television screens, computer monitors, small or portable system screens such as those found on mobile phones and the like.

A typical OLED comprises at least two organic layers, e.g. a conductive layer and an emissive layer, that are embedded between two electrodes. One electrode typically is made of a reflective metal. The other electrode typically is a transparent conductive coating (TCC) supported by a glass substrate. Indium tin oxide (ITO) is often used at the front portion of the OLED as the anode.

During operation, a voltage is applied across the OLED such that the anode is positive with respect to the cathode. A current of electrons flows through the device from cathode to anode and electrostatic forces bring the electrons and the holes towards each other and they recombine closer to the emissive layer resulting in the emission of radiation whose frequency is in the visible region.

LEDs and OLEDs are typically fabricated by providing a transparent conducting electrode comprising a transparent substrate and a conductive coating stack, and building successive layers thereon comprising the active region of the device and a further electrode—which may also be transparent. The transparent conducting electrode is frequently realised by depositing the conductive stack of coatings on the substrate using techniques such as CVD. The conductive stack typically comprises a TCC, such as a TCO, e.g. a doped metal oxide, as the uppermost layer (i.e. the furthest layer from the substrate). In addition to offering the requisite electrical properties and mechanical stability, the TCO should offer a suitable surface for deposition of further layers as the rest of the device is fabricated.

For LEDs and OLEDs the emphasis is clearly on extracting the light from the device such that it can serve its purpose rather than merely heating the device. Edge-lit LED luminaires, for instance, could benefit from light outcoupling (the escape of photons from an LED) by increasing light scattering. The extraction of light from OLED panels has hitherto generally been enhanced by the use of an external light extraction film e.g. on the external surface of a transparent substrate. It would be a significant breakthrough for OLED manufacture to provide an integrated substrate that combines an internal light extraction structure and a TCC.

Glazings for use in horticulture, e.g. in greenhouses, preferably transmit diffuse light and therefore glazings that can scatter light are of interest in this field.

DETAILED DESCRIPTION OF THE INVENTION

According to a first aspect of the present invention there is provided a coated glazing comprising:

a transparent glass substrate, wherein a surface of the substrate is directly or indirectly coated with at least one layer based on a transparent conductive coating (TCC) and/or at least one layer based on a material with a refractive index of at least 1.75, and wherein said surface has an arithmetical mean height of the surface value, Sa, of at least 0.4 nm prior to said coating of said surface.

It has surprisingly been found that the coated glazing of the present invention exhibits light scattering such that its use in LEDs and OLEDs can afford improved light extraction. Furthermore, these coated glazings are also applicable to PV modules in order to promote the trapping of light to boost efficiency. The light scattering properties of these coated glazings can additionally be exploited in horticultural applications.

In the following discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

In the context of the present invention, where a layer is said to be "based on" a particular material or materials, this means that the layer predominantly consists of the corresponding said material or materials, which means typically that it comprises at least about 50 at. % of said material or materials.

Preferably said surface has an arithmetical mean height of the surface value, Sa, of at least 0.6 nm, more preferably at least 0.8 nm, even more preferably at least 1.0 nm, even more preferably at least 1.5 nm, most preferably at least 3 nm, prior to said at least partial coating of said surface. Preferably said surface has an Sa value of at most 25 nm, more preferably at most 20 nm, even more preferably at most 15 nm, most preferably at most 10 nm, prior to said coating of said surface. Sa gives an indication of the roughness of a surface. A rougher surface leads to a glazing that exhibits more light scattering and is therefore useful in a number of applications as detailed above. However, the rougher a surface is, the more challenging it is to deposit layers in order to provide a working PV, LED or OLED device, since a rougher surface is more likely to cause electrical shorts, which affect device performance.

Preferably said surface, to a depth of 100 nm, has a porosity of at least 0.2, more preferably at least 0.3, even more preferably at least 0.4, most preferably at least 0.5, but preferably at most 0.95, more preferably at most 0.9, even more preferably at most 0.8, most preferably at most 0.7. Said porosity may be prior to said coating of said surface. In the context of the present invention porosity or void fraction is a measure of the void (i.e., "empty") spaces in a material, and is a fraction of the volume of voids over the total volume, between 0 and 1. A more porous surface leads to a glazing that exhibits more light scattering and is therefore useful in a number of applications as detailed above.

Preferably said glazing exhibits a haze of at least 0.4%, more preferably at least 0.5%, even more preferably at least 0.6%, most preferably at least 0.7%, but preferably at most 4.0%, more preferably at most 3.0%, even more preferably at most 2.0%, most preferably at most 1.5%. The haze values are to be measured in accordance with the ASTM D 1003-61 standard. Glazings with these preferred haze values are useful in a number of applications as detailed above.

Preferably the surface is completely coated with at least one layer based on a TCC and/or at least one layer based on a material with a refractive index of at least 1.75.

Preferably the TCC is a transparent conductive oxide (TCO). Preferably the TCO is one or more of fluorine doped tin oxide ($SnO_2$:F), zinc oxide doped with aluminium, gallium or boron (ZnO:Al, ZnO:Ga, ZnO:B), indium oxide doped with tin (ITO), cadmium stannate, ITO:ZnO, ITO:Ti, $In_2O_3$, $In_2O_3$—ZnO (IZO), $In_2O_3$:Ti, $In_2O_3$:Mo, $In_2O_3$:Ga, $In_2O_3$:W, $In_2O_3$:Zr, $In_2O_3$:Nb, $In_{2-2x}M_xSn_xO_3$ with M being Zn or Cu, ZnO:F, $Zn_{0.9}Mg_{0.1}$O:Ga, and (Zn,Mg)O:P, ITO:Fe, $SnO_2$:Co, $In_2O_3$:Ni, $In_2O_3$:(Sn,Ni), ZnO:Mn, and ZnO:Co.

Preferably each layer of the at least one layer based on a TCC has a thickness of at least 20 nm, more preferably at least 100 nm, even more preferably at least 200 nm, most preferably at least 300 nm; but preferably at most 550 nm, more preferably at most 450 nm, even more preferably at most 370 nm, most preferably at most 350 nm. These thicknesses are preferred in order to strike a balance between the properties of 1) conductivity 2) absorption (the thicker the layer the more absorption and the lower the transmission) and 3) colour suppression (certain thicknesses are better for obtaining a neutral colour).

Preferably the material with a refractive index of at least 1.75 has a refractive index of at least 1.8, more preferably at least 1.9, even more preferably at least 2.0, but preferably at most 4.5, more preferably at most 3.5, even more preferably at most 3.0. Preferably the material with a refractive index of at least 1.75 is one or more of $SnO_2$, $TiO_2$, and ZnO. Materials with these refractive indexes have been found to amplify the light scattering exhibited by the resultant coated glazings.

Preferably each layer of the at least one layer based on a material with a refractive index of at least 1.75 has a thickness of at least 10 nm, more preferably at least 50 nm, even more preferably at least 100 nm, most preferably at least 120 nm; but preferably at most 250 nm, more preferably at most 200 nm, even more preferably at most 170 nm, most preferably at most 150 nm. These preferred thicknesses provide the desired light scattering amplification whilst avoiding excessive absorption.

Preferably the glazing further comprises at least one layer based on an oxide of a metal or of a metalloid, such as $SiO_2$, $SnO_2$, $TiO_2$, silicon oxynitride and/or aluminium oxide. One layer of said at least one layer based on an oxide of a metal or of a metalloid is preferably located in direct contact with said surface of the glass substrate. Additionally, or alternatively, one layer of said at least one layer based on an oxide of a metal or of a metalloid is preferably located in direct contact with the layer based on a TCC or the layer based on a material with a refractive index of at least 1.75. Such a layer based on an oxide of a metal or of a metalloid may act as a blocking layer to prevent the diffusion of sodium ions to the surface, which can be a source of corrosion, or it may act as a colour suppression layer to suppress iridescent reflection colours resulting from variations in thickness of the layers.

Preferably each layer of the at least one layer based on an oxide of a metal or of a metalloid has a thickness of at least 5 nm, more preferably at least 10 nm, even more preferably at least 15 nm, most preferably at least 20 nm; but preferably at most 100 nm, more preferably at most 50 nm, even more preferably at most 40 nm, most preferably at most 30 nm.

The glazing may further comprise one or more additional layers to effectively planarise the surface to assist with the subsequent deposition of layers to form e.g. PV, LED or OLED devices. Manufacturers of such devices may need to consider the planarity of the surface of the coated glazing in their material selection.

The glass substrate may directly contact the layer based on a TCC or the layer based on a material with a refractive index of at least 1.75. When both the layer based on a TCC and the layer based on a material with a refractive index of at least 1.75 are present, preferably the layer based on a TCC directly contacts the layer based on a material with a refractive index of at least 1.75 such that there are no intervening layers.

In some embodiments the surface is coated with a layer based on a TCC and a layer based on a material with a refractive index of at least 1.75. Preferably the layer based on a material with a refractive index of at least 1.75 is located nearer to the glass substrate than the layer based on a TCC.

Heat treated glass panes which are toughened to impart safety properties and/or are bent are required for a large number of areas of application. It is known that for thermally toughening and/or bending glass panes it is necessary to process the glass panes by a heat treatment at temperatures near or above the softening point of the glass used and then either to toughen them by rapid cooling or to bend them with the aid of bending means. The relevant temperature range for standard float glass of the soda lime silica type is typically about 580-690° C., the glass panes being kept in this temperature range for several minutes before initiating the actual toughening and/or bending process.

"Heat treatment", "heat treated" and "heat treatable" in the following description and in the claims refer to thermal bending and/or toughening processes such as mentioned before and to other thermal processes during which a coated glass pane reaches temperatures in the range of about 580-690° C. for a period of several minutes, e.g., for about 5 minutes, preferably for about 10 minutes. A coated glass pane is deemed to be heat treatable if it survives a heat treatment without significant damage, typical damages caused by heat treatments being high haze values, pinholes or spots. Preferably the coated glazing according to the present invention is heat treatable.

Preferably the glass substrate is a soda lime silica or borosilicate glass substrate.

According to a second aspect of the present invention there is provided a method of manufacture of a coated glazing comprising the following steps in sequence:
a) providing a transparent glass substrate,
b) etching a surface of the substrate with an acidic gas,
c) directly or indirectly coating said surface with at least one layer based on a transparent conductive coating (TCC) and/or at least one layer based on a material with a refractive index of at least 1.75.

It has surprisingly been found that by acid etching a surface of a glass substrate and subsequently coating said surface with a layer based on a transparent conductive coating (TCC) and/or a layer based on a material with a refractive index of at least 1.75 that a coated glazing with beneficial light scattering properties can be obtained. Such a glazing can be used in LEDs and OLEDs to improve light extraction, in PV modules to promote the trapping of light to boost efficiency, and in horticultural applications where the transmission of diffuse light is favoured.

Preferably step b) is carried out using Chemical Vapour Deposition (CVD). Both steps b) and c) may be carried out using CVD. Alternatively, when said surface is to be coated with both a layer based on a TCC and a layer based on a material with a refractive index of at least 1.75, the first of said layers that is deposited on said surface may be deposited using CVD and at least one of the subsequently deposited layers may be deposited using physical vapour deposition (PVD).

Step c) may further comprise directly or indirectly coating said surface of the glass substrate with at least one layer based on an oxide of a metal or of a metalloid, as set out in accordance with the first aspect of the present invention. Preferably one of said at least one layer directly coats said surface of the glass substrate such that there are no intervening layers. Preferably said layer based on an oxide of a metal or of a metalloid is deposited using CVD. When said surface is coated with at least one layer based on an oxide of a metal or of a metalloid, and at least one layer based on a TCC and/or at least one layer based on a material with a refractive index of at least 1.75, the first of said layers that is deposited on said surface may preferably be deposited using CVD and at least one of the subsequently deposited layers may preferably be deposited using PVD. When at least three layers are deposited on said surface of the substrate, preferably at least the first two layers that are deposited on said surface are deposited using CVD.

Preferably the surface area of the outer surface of the layer furthest from the glass substrate is greater than the surface area of the outer surface of the layer furthest from the glass substrate of a correspondingly coated glazing manufactured by the same method except that step b) was omitted. Preferably the surface area of the outer surface of the layer furthest from the glass substrate is 2% greater, more preferably 5% greater, even more preferably 10% greater, most preferably 15% greater than the surface area of the outer surface of the layer furthest from the glass substrate of a correspondingly coated glazing manufactured by the same method except that step b) was omitted.

Preferably the surface area of said surface of the glass substrate is greater after step b) than the surface area of said surface before step b). Preferably the surface area of said surface of the glass substrate is 2% greater, more preferably 5% greater, even more preferably 10% greater, most preferably 15% greater after step b) than the surface area of said surface before step b).

Preferably the acidic gas comprises one or more of a fluorine- or chlorine-containing acid such as HF and/or HCl, and/or phosphoric acid. The phosphoric acid may be derived from triethyl phosphite (TEP). The acidic gas may further comprise water vapour, the presence of which can help control the etching process. The ratio of the volume of water vapour to the volume of acid in the acidic gas is preferably at least 0.1, more preferably at least 0.5, even more preferably at least 1.0, most preferably at least 1.5, but preferably at most 40, more preferably at most 30, even more preferably at most 20, most preferably at most 10.

The CVD may be carried out in conjunction with the manufacture of the glass substrate. In an embodiment, the glass substrate may be formed utilizing the well-known float glass manufacturing process. In this embodiment, the glass substrate may also be referred to as a glass ribbon. Conveniently the CVD etching of step b) or coating of step c) will be carried out either in the float bath, in the lehr or in the lehr gap. The preferred method of CVD is atmospheric pressure CVD (e.g. online CVD as performed during the float glass process). However, it should be appreciated that the CVD process can be utilized apart from the float glass manufacturing process or well after formation and cutting of the glass ribbon.

The CVD may preferably be carried out when the glass substrate is at a temperature in the range 450° C. to 800° C., more preferably when the glass substrate is at a temperature in the range 550° C. to 700° C. Depositing a CVD coating when the glass substrate is at these preferred temperatures affords greater crystallinity of the coating, which can improve toughenability (resistance to heat treatment).

In certain embodiments, the CVD process is a dynamic process in which the glass substrate is moving at the time of etching or coating. Preferably, the glass substrate moves at a predetermined rate of, for example, greater than 3.175 m/min during step b) and/or step c). More preferably the glass substrate is moving at a rate of between 3.175 m/min and 12.7 m/min during step b) and/or step c).

As detailed above, preferably the CVD may be carried out during the float glass production process at substantially atmospheric pressure. Alternatively the CVD may be carried out using low-pressure CVD or ultrahigh vacuum CVD. The CVD may be carried out using aerosol assisted CVD or direct liquid injection CVD. Furthermore, the CVD may be carried out using microwave plasma-assisted CVD, plasma-enhanced CVD, remote plasma-enhanced CVD, atomic layer CVD, combustion CVD (flame pyrolysis), hot wire CVD, metalorganic CVD, rapid thermal CVD, vapour phase epitaxy, or photo-initiated CVD. The glass substrate will usually be cut into sheets after deposition of the CVD coating(s) in step c) (and before deposition of any PVD coatings) for storage or convenient transport from the float glass production facility to a vacuum deposition facility.

The CVD may also comprise forming a gaseous mixture. As would be appreciated by those skilled in the art, the precursor compounds suitable for use in the gaseous mixture should be suitable for use in a CVD process. Such compounds may at some point be a liquid or a solid but are volatile such that they can be vaporised for use in a gaseous mixture. Once in a gaseous state, the precursor compounds can be included in a gaseous stream and utilized in a CVD process to carry out steps b) and/or c). For any particular combination of gaseous precursor compounds, the optimum concentrations and flow rates for achieving a particular etching/deposition rate and coating thickness may vary.

Preferably any steps carried out using CVD involve the preparation of a precursor gas mixture. Preferably step b) is carried out using a precursor gas mixture comprising HF and/or HCl, and water. Alternatively, step b) may be carried out using a precursor gas mixture comprising phosphoric acid and/or TEP, wherein said precursor gas mixture may also comprise water.

The precursor gas mixture may further comprise a carrier gas or diluents, for example, nitrogen, air and/or helium, preferably nitrogen.

For the deposition of $SnO_2$ via CVD the precursor gas mixture preferably comprises dimethyl tin dichloride (DMT), oxygen and steam. The same mixture can be used to deposit $SnO_2$:F provided a source of flurorine is added, such as HF. For the deposition of silica the precursor gas mixture may comprise silane ($SiH_4$) and ethylene ($C_2H_4$). For the deposition of titania the precursor gas mixture may comprise titanium tetrachloride ($TiCl_4$) and ethyl acetate (EtOAc). Preferably the precursor gas mixtures comprise nitrogen. In some embodiments the precursor gas mixture may also comprise helium.

Preferably the surface of the glass substrate that is etched and coated is the gas side surface. Coated glass manufacturers usually prefer depositing coatings on the gas side surface (as opposed to the tin side surface for float glass) because deposition on the gas side surface can improve the properties of the coating.

Preferably the PVD is carried out by sputter deposition. It is particularly preferred that the PVD is magnetron cathode sputtering, either in the DC mode, in the pulsed mode, in the medium or radio frequency mode or in any other suitable mode, whereby metallic or semiconducting targets are sputtered reactively or non-reactively in a suitable sputtering atmosphere. Depending on the materials to be sputtered, planar or rotating tubular targets may be used. The coating process is preferably carried out by setting up suitable coating conditions such that any oxygen (or nitrogen) deficit of any oxide (or nitride) layer of any layers of the coating is kept low to achieve a high stability of the visible light transmittance and colour of the coated glazing, particularly during a heat treatment.

According to a third aspect of the present invention there is provided a coated glazing manufactured by the method according to the second aspect.

According to a fourth aspect of the present invention there is provided the use of an acidic gas to increase the haze exhibited by a coated glazing comprising:
a) providing a transparent glass substrate,
b) etching a surface of the substrate with an acidic gas,
c) directly or indirectly coating said surface with at least one layer based on a transparent conductive coating (TCC) and/or at least one layer based on a material with a refractive index of at least 1.75.

According to a fifth aspect of the present invention there is provided the use of a coated glazing according to the first or third aspect as a horticultural glazing or as a component of a PV module, of an LED or of an OLED.

According to a sixth aspect of the present invention there is provided a PV module incorporating the coated glazing according to the first or third aspect.

According to a seventh aspect of the present invention there is provided an LED incorporating the coated glazing according to the first or third aspect.

According to an eighth aspect of the present invention there is provided an OLED incorporating the coated glazing according to the first or third aspect.

It will be appreciated that optional features applicable to one aspect of the invention can be used in any combination, and in any number. Moreover, they can also be used with any of the other aspects of the invention in any combination and in any number. This includes, but is not limited to, the dependent claims from any claim being used as dependent claims for any other claim in the claims of this application.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention will now be further described by way of the following specific embodiments, which are given by way of illustration and not of limitation:

EXAMPLES

All treatments and layer depositions were carried out using CVD. The acidic gas treatments of the glass surface were all carried out on uncoated glass.

The Examples shown in Table 1 were conducted on a float line using a 3.2 mm glass substrate, at a line speed of 14.4 m/min. The glass temperature upstream of a coater A was 680.5° C.

For the uncoated samples, the glass surface treatment was carried out using the following gas flows in coater A:
The "HF only" treatment consisted of 85 slm (standard liters per minute) of $N_2$ gas and 10 slm of HF gas.
The "HCl only" treatment consisted of 85 slm of $N_2$ gas and 15 slm of HCl gas.
The "HCl+$H_2O$" treatment consisted of 10 slm of $N_2$ gas, 30 slm of HCl gas, and 161 slm $H_2O$.

For the coated samples, the glass surface treatment was carried out (prior to coating) using similar gas flows in coater A:
The "HF only" treatment consisted of 85 slm of $N_2$ gas and 10 slm of HF gas.
The "HCl only" treatment consisted of 85 slm of $N_2$ gas and 30 slm of HCl gas.
The "HCl+$H_2O$" treatment consisted of 25 slm of $N_2$ gas, 30 slm of HCl gas, and 161 slm $H_2O$.

A $SiO_2$ layer (~25 nm thick) was deposited over the treated glass surface using coater B2 (downstream from A):
The gas flows for the silica deposition consisted of 370 slm of $N_2$ carrier gas, 200 slm of He carrier gas, 27 slm of $O_2$, 32 slm of $C_2H_4$, and 4.5 slm of $SiH_4$.

A $SnO_2$:F layer (~330 nm thick) was deposited over the treated glass surface using coaters C and D (next coaters downstream from B2):
The gas flows for coater C consisted of 140 slm of He carrier gas, 230 slm of $O_2$, 31 pounds/hr dimethyltin dichloride, 12 slm HF, and 322 slm $H_2O$.
The gas flows for coater D consisted of 140 slm of He carrier gas, 230 slm of $O_2$, 31 pounds/hr dimethyltin dichloride, 15 slm HF, and 267 slm $H_2O$.

The haze values of the samples were measured in accordance with the ASTM D 1003-61 standard.

TABLE 1

Percentage haze values exhibited by uncoated glass and coated glass samples after treating the samples as shown. In accordance with the present invention, the coated glass samples were treated during their manufacture, prior to the deposition of the $SiO_2$ and $SnO_2$:F layers.

| | Haze (%) | |
| --- | --- | --- |
| | Uncoated Glass | Coated Glass (Glass/ 25 nm $SiO_2$/330 nm $SnO_2$:F) |
| Untreated | 0.08 | 0.37 |
| HF only | 0.10 | 0.49 |
| HCl only | 0.16 | 3.36 |
| HCl and $H_2O$ | 0.06 | 4.60 |

Table 1 shows that for the coated glass sample of the present invention, all of the treatments (carried out prior to coating) result in improved haze values in comparison with the untreated sample, and in comparison with the correspondingly treated uncoated samples. Moreover, the two treatments that use HCl result in far higher haze values than the HF treatment. The high haze achieved with the HCl treatments is even more pronounced when compared to the correspondingly treated uncoated samples.

The invention is not restricted to the details of the foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A coated glazing comprising:
an acid-gas etched transparent glass substrate,
wherein a surface of the substrate is directly or indirectly coated with at least one layer based on a transparent conductive coating (TCC) and/or at least one layer based on a material with a refractive index of at least 1.75, and
wherein said surface has an arithmetical mean height of the surface value, Sa, of at least 0.4 nm prior to said coating of said surface, and
wherein said dazing exhibits a haze of at least 0.5%.

2. The glazing according to claim 1, wherein said surface has an arithmetical mean height of the surface value, Sa, of at least 0.6 nm prior to said coating of said surface.

3. The glazing according to claim 1, wherein when said surface of the substrate is directly or indirectly coated with at least one layer based on a transparent conductive coating (TCC), the TCC is a transparent conductive oxide (TCO) and wherein the TCO is one or more of fluorine doped tin oxide (SnO:F), zinc oxide doped with aluminium, gallium or boron (ZnO:Al, ZnO:Ga, ZnO:B), indium oxide doped with tin (ITO), cadmium stannate, ITO:ZnO, ITO:Ti, $In_2O_3$, $In_2O_3$—ZnO (IZO), $In_2O_3$:Ti, $In_2O_3$:Mo, $In_2O_3$:Ga, $In_2O_3$:W, $In_2O_3$:Zr, $In_2O_3$:Nb, $In_{2-2x}M_xSn_xO_3$ with M being Zn or Cu, ZnO:F, $Zn_{0.9}Mg_{0.1}O$:Ga, and (Zn,Mg)O:P, ITO:Fe, $SnO_2$:Co, $In_2O_3$:Ni, $In_2O_3$:(Sn,Ni), ZnO:Mn, and ZnO:Co.

4. The glazing according to claim 1 wherein when said surface of the substrate is directly or indirectly coated with at least one layer based on a transparent conductive coating (TCC), each layer of the at least one layer based on a TCC has a thickness of 100 nm, but at most 450 nm.

5. The glazing according to claim 1 wherein when said surface of the substrate is directly or indirectly coated with at least one layer based on a material with a refractive index of at least 1.75, the material with a refractive index of at least 1.75 is one or more of $SnO_2$, $TiO_2$, and ZnO.

6. The glazing according to claim 1 wherein when said surface of the substrate is directly or indirectly coated with at least one layer based on a material with a refractive index of at least 1.75, each layer of the at least one layer based on a material with a refractive index of at least 1.75 has a thickness of at least 50 nm, but at most 200 nm.

7. The glazing according to claim 1, wherein the glazing further comprises at least one layer based on an oxide or of a metalloid selected from the group consisting of $SiO_2$, $SnO_2$, $TiO_2$, silicon oxynitride and aluminium oxide.

8. The glazing according to claim 7, wherein one layer of said at least one layer based on an oxide of a metal or of a metalloid is located in direct contact with said surface of the glass substrate.

9. The glazing according to claim 7, wherein each layer of the at least one layer based on an oxide of a metal or of a metalloid has a thickness of at least 10 nm, but at most 35 nm.

10. The glazing according to claim 1, wherein the glazing is heat treatable.

11. A PV module incorporating the coated glazing according to claim 1.

12. An LED incorporating the coated glazing according to claim 1.

13. An OLED incorporating the coated glazing according to claim 1.

* * * * *

UNITED STATES PATENT AND TRADEMARK OFFICE
CERTIFICATE OF CORRECTION

PATENT NO. : 10,550,032 B2
APPLICATION NO. : 15/330149
DATED : February 4, 2020
INVENTOR(S) : Kevin David Sanderson et al.

It is certified that error appears in the above-identified patent and that said Letters Patent is hereby corrected as shown below:

In the Claims

Column 10, Line 62: Claim 1: the phrase "wherein said dazing" should read "wherein said glazing".

Signed and Sealed this
Fifth Day of May, 2020

Andrei Iancu
*Director of the United States Patent and Trademark Office*